US005621406A

United States Patent [19]
Goetzinger et al.

[11] Patent Number: 5,621,406
[45] Date of Patent: Apr. 15, 1997

[54] SYSTEM FOR CALIBRATING ANALOG-TO-DIGITAL CONVERTER

[75] Inventors: Charles E. Goetzinger, Bloomington; David E. Tetzlaff, Minnetonka, both of Minn.

[73] Assignee: Rosemount Inc., Eden Prairie, Minn.

[21] Appl. No.: 315,102

[22] Filed: Sep. 29, 1994

[51] Int. Cl.⁶ ................................................. H03M 1/10
[52] U.S. Cl. ........................ 341/120; 341/118; 341/172
[58] Field of Search ..................................... 341/118, 120, 341/172

[56] References Cited

U.S. PATENT DOCUMENTS

| | | | |
|---|---|---|---|
| 4,023,160 | 5/1977 | Kirschner | 340/347 |
| 4,121,461 | 10/1978 | Butler et al. | 73/362 |
| 4,268,820 | 5/1981 | Hareyama | 340/347 |
| 4,357,600 | 11/1982 | Ressmeyer et al. | 340/347 |
| 4,364,045 | 12/1982 | Spiegel | 340/870 |
| 4,559,521 | 12/1985 | Yada | 340/347 |
| 4,709,225 | 11/1987 | Welland et al. | 340/347 |
| 4,839,651 | 6/1989 | Banno | 341/120 |
| 4,896,155 | 1/1990 | Craiglow | 341/120 |
| 4,908,621 | 3/1990 | Polonio et al. | 341/120 |
| 5,119,033 | 6/1992 | Frick et al. | 324/607 |
| 5,172,115 | 12/1992 | Kerth et al. | 341/118 |
| 5,294,926 | 3/1994 | Corcoran | 341/120 |

OTHER PUBLICATIONS

"Isolation Amplifier Based on Sigma Delta Moduation", *National Aeronatuics and Space Administration Tech Briefs*, Technical Support Package, vol. 18(7), Jul. 1994.

"High Speed A/D Converter With Variable Integrating Time", by Yada, Honjoand Hirose, *IEEE*, Catalog No. 86CH2271-5, 17 Jul. 1986, pp. 144-147.

Primary Examiner—Jeffrey A. Gaffin
Assistant Examiner—Peguy JeanPierre
Attorney, Agent, or Firm—Westman, Champlin & Kelly, P.A.

[57] ABSTRACT

A calibrating system calibrates an analog-to-digital converter which has an integrator and first and second reference current sources. A quantity of charge is accumulated in the integrator. The quantity of charge is removed from the integrator by applying the first and second reference currents to the integrator for first and second time periods until the accumulated charge reaches a threshold level. The quantity of charge is reaccumulated in the integrator and again removed by applying the first and second reference currents for third and fourth time periods wherein the first and second time periods are different from the third and fourth time periods. The relative magnitude of the first and second reference currents is determined based on the first, second, third and fourth time periods.

33 Claims, 7 Drawing Sheets

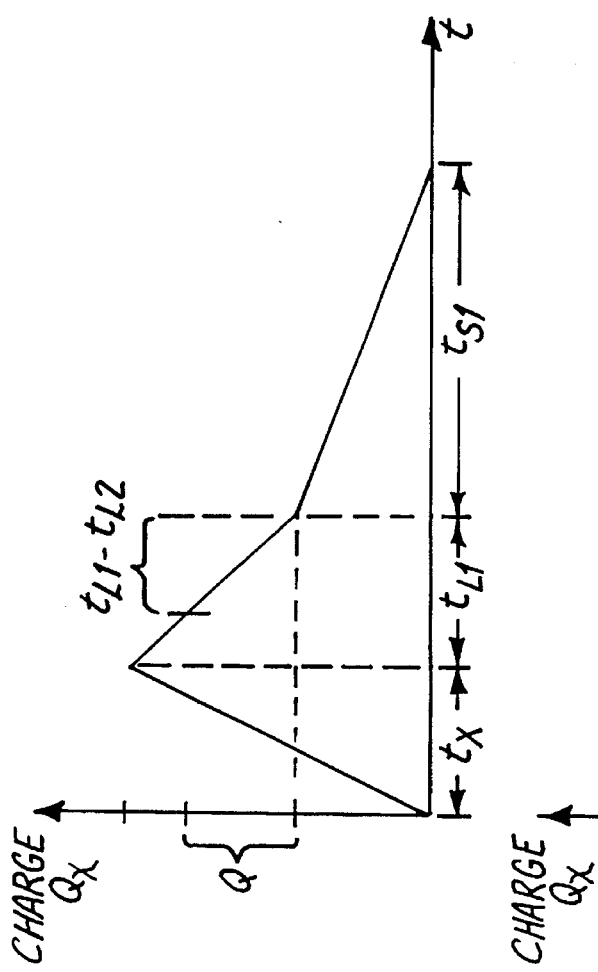
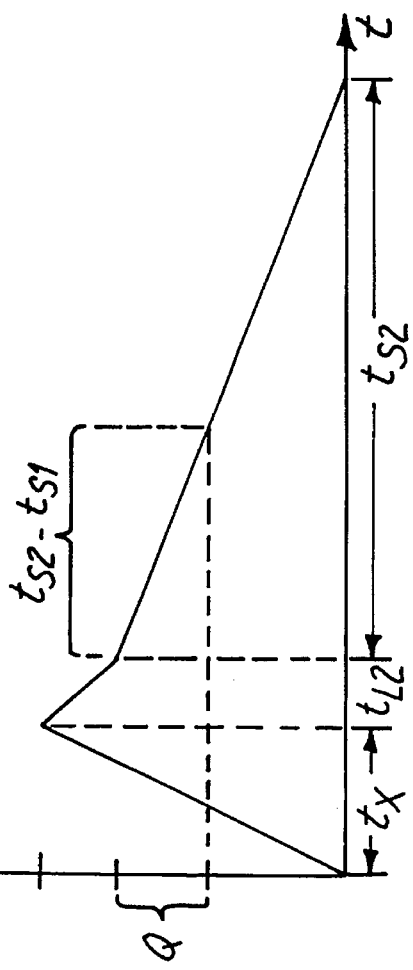
Fig. 5B
Fig. 5C

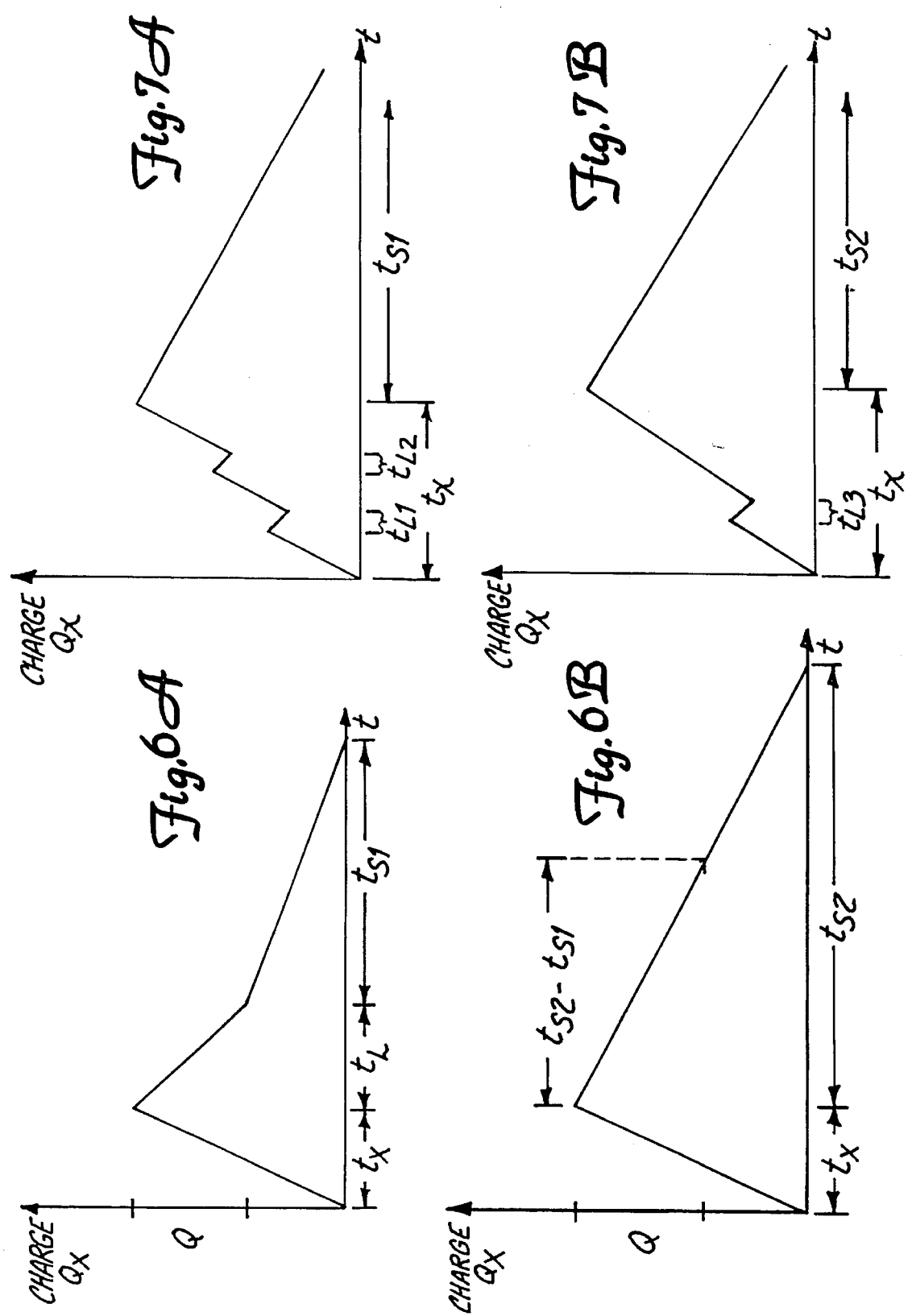

SYSTEM FOR CALIBRATING ANALOG-TO-DIGITAL CONVERTER

BACKGROUND OF THE INVENTION

The present invention deals with analog-to-digital (A/D) converters. More specifically, the present invention is a system for calibrating A/D converters.

Charge balanced A/D converters are generally known. An example of a charge balanced A/D converter is a dual slope A/D converter which includes an integrator, a reference current source which applies a reference current $I_{REF}$ to the integrator, and a variable current source that provides a variable current $I_X$ which is representative of an unknown variable. In a dual slope A/D conversion, the variable current, $I_X$, is integrated for a time period, $t_X$. The quantity of charge, Q, accumulated in the integrator is equal to $I_X$ times $t_X$. A known reference current $I_{REF}$, having a polarity opposite that of $I_X$, is then applied to the integrator to remove charge from the integrator (i.e., discharge the integrator). The reference current $I_{REF}$ is applied for a time period $t_R$ until the charge on the integrator reaches the initial charge level on the integrator prior to integration of the variable current $I_X$. The charge removed from the integrator is equal to $I_{REF}$ times $t_R$.

The variable current $I_X$ (and hence the unknown variable) is determined as follows:

$$I_X \cdot t_X = I_{REF} \cdot t_R \qquad \text{Eq. 1}$$

Therefore, $$I_X = I_{REF} \cdot \frac{t_R}{t_X} \qquad \text{Eq. 2}$$

Since $I_{REF}$, $t_R$ and $t_X$ are all known, $I_X$ can be calculated.

A problem with conventional dual slope A/D converters is that they typically have a very limited dynamic range which is determined by the minimum and maximum power supply voltages of the circuit (e.g., the rail voltages, which are typically zero to five volts). For instance, the integrator cannot change above or below the rail voltages. This places limitations on either the charging currents or the integration time or both. This, in turn, limits the range of the converter.

In order to overcome this problem, A/D converters have been operated by adding a comparator to the circuit and determining when the output of the integrator is approaching the rail voltage. As the output of the integrator approaches the rail voltage, the reference current is applied to the integrator along with the variable current to remove charge from the integrator so that the integration can be done over a longer period of time to effectively increase the dynamic range of the integrator. Such operation requires the reference current $I_{REF}$ to have a greater magnitude than the magnitude of variable current $I_X$. This allows application of $I_{REF}$ to remove charge from the integrator quickly enough so that the integrator does not approach the rail voltage, even while $I_X$ is still being integrated.

However, setting the magnitude of $I_{REF}$ to be significantly larger than $I_X$ decreases the resolution of the A/D converter. In order to add resolution to the A/D converter, a second reference current source $I_{REF2}$ has been added to the dual slope A/D converter. The second reference current $I_{REF2}$ has a smaller magnitude than that of the first reference current $I_{REF}$. Thus, after the variable current $I_X$ has been integrated, and the first reference current $I_{REF}$ discharges the integrator for a desired time period $t_R$, then the second reference current $I_{REF2}$ discharges any residual charge on the integrator. Since the magnitude of the second reference current is significantly smaller than the magnitude of the first reference current, the resolution of the A/D converter is greatly increased.

Adding a second reference current source, however, has introduced additional problems. For example, the accuracy of the A/D converter output is highly dependent upon the precise ratio between the two reference currents $I_{REF}$ and $I_{REF2}$. If the ratios are different than expected, differential errors or non-linearities can occur in the A/D converter output which are very difficult to correct.

Prior attempts to alleviate this problem involved custom layout of current sources on silicon, which are error prone and require significant amounts of development time. Special integrated circuit manufacturing steps add cost, undesired complexity and also limit the portability of the design between silicon manufacturing facilities, so that a precise ratio between the current sources is very difficult to obtain.

SUMMARY OF THE INVENTION

A calibrating system calibrates an analog-to-digital converter which has an integrator and first and second reference current sources. A quantity of charge is accumulated in the integrator. The quantity of charge is removed from the integrator by applying the first and second reference currents to the integrator for first and second time periods until the accumulated charge reaches a threshold level. The quantity of charge is reaccumulated in the integrator and again removed by applying the first and second reference currents for third and fourth time periods wherein the first and second time periods are different from the third and fourth time periods. The relative magnitude of the first and second reference currents is determined based on the first, second, third and fourth time periods.

BRIEF DESCRIPTION OF THE DRAWINGS

FIGS. 5B and 5C are plots of the integrator output using the calibration system according to the present invention.

FIGS. 6A and 6B are plots of the integrator output using a second embodiment of the calibration system according to the present invention.

FIGS. 7A and 7B are plots of the integrator output using a third embodiment of the calibration system according to the present invention.

DETAILED DESCRIPTION OF THE PREFERRED EMBODIMENTS

1. Conversion Overview

Figure 1:
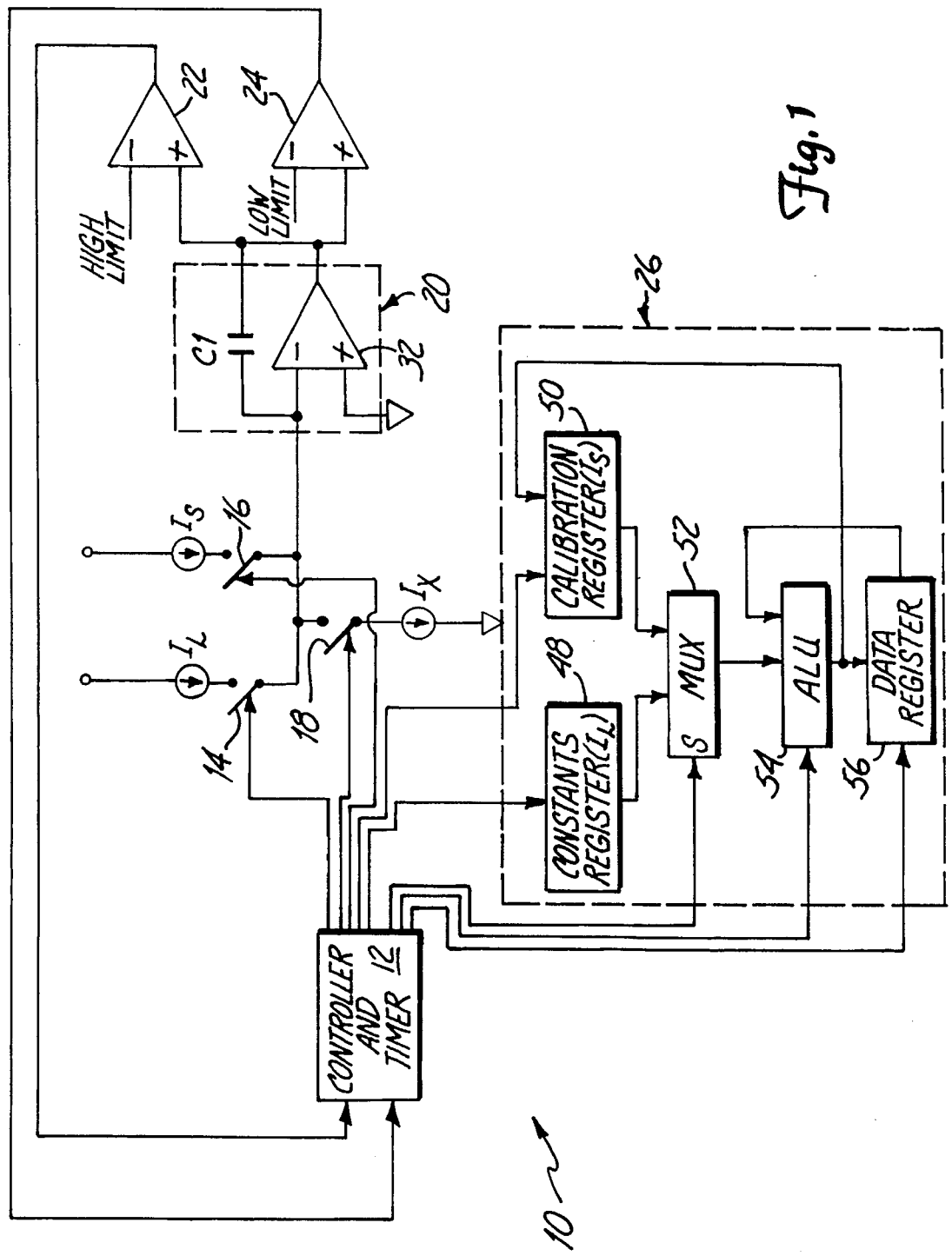
FIG. 1 is a block diagram of an A/D converter according to the present invention.

FIG. 1 is a block diagram of an analog-to-digital (A/D) converter 10. A/D converter 10 includes a controller and timer 12, a pair of reference current sources $I_L$ and $I_S$, a variable current source $I_X$, a plurality of MOS switches 14, 16, and 18, an integrator 20, a pair of comparators 22 and 24, and an output block 26.

Variable current source $I_X$ provides a variable analog current $I_X$ which has a magnitude representative of an unknown (or sensed) parameter. To initialize A/D converter 10, high and low voltage limits $V_H$ and $V_L$, respectively, are applied to the inverting inputs of comparators 22 and 24. Also, controller 12 operates switches 14 and 16 to connect current sources $I_L$ and $I_S$ to integrator 20 to set the output of integrator 20 to the low limit.

During a normal conversion cycle, the value of $I_X$ is measured in essentially a two-step process. During the first step of the conversion, controller 12 opens switches 14 and 16 and closes switch 18 to cause integrator 20 to accumulate a quantity of charge $Q_X$ from current source $I_X$ over an integration time period $t_X$.

During the second step, controller 12 operates switches 14 and 16 to apply currents $I_L$ and $I_S$ to remove the accumulated charge $Q_X$ from integrator 20. Currents $I_L$ and $I_S$ are substantially known. The magnitude of current from source $I_L$ is greater than the magnitude of current from source $I_S$. Controller 12 includes a timer which can either be integrated into a controller chip along with controller 12, or which can be a discrete timer. Controller 12 can select the time periods that each current source $I_S$ and $I_L$ are connected to integrator 20 to remove the accumulated charge from integrator 20. Based upon these time periods, controller 12 controls output block 26 to store a digital number representative of the analog value of current $I_X$, and consequently representative of the sensed variable represented by current $I_X$.

2. Detailed Operation Of A/D Converter 10

Figure 2A:
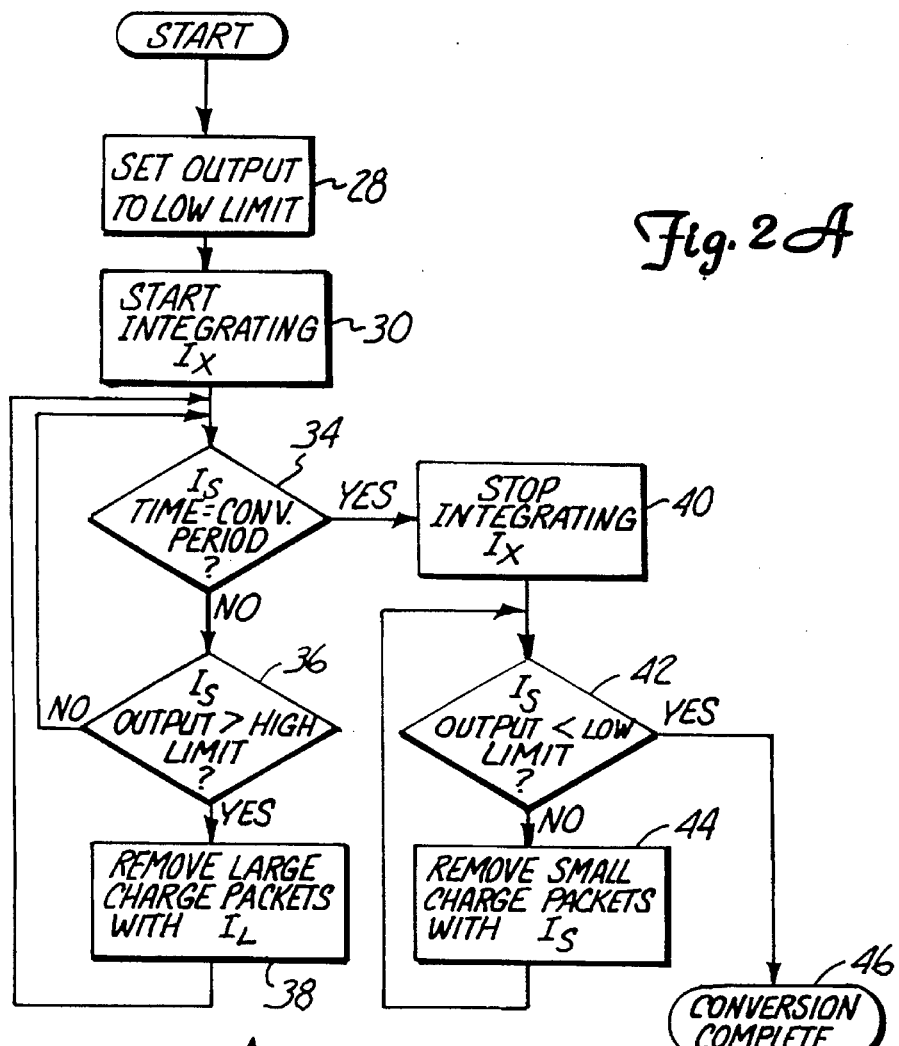
FIG. 2A is a flow diagram of a normal A/D conversion using the A/D converter shown in FIG. 1.
Figure 2B:
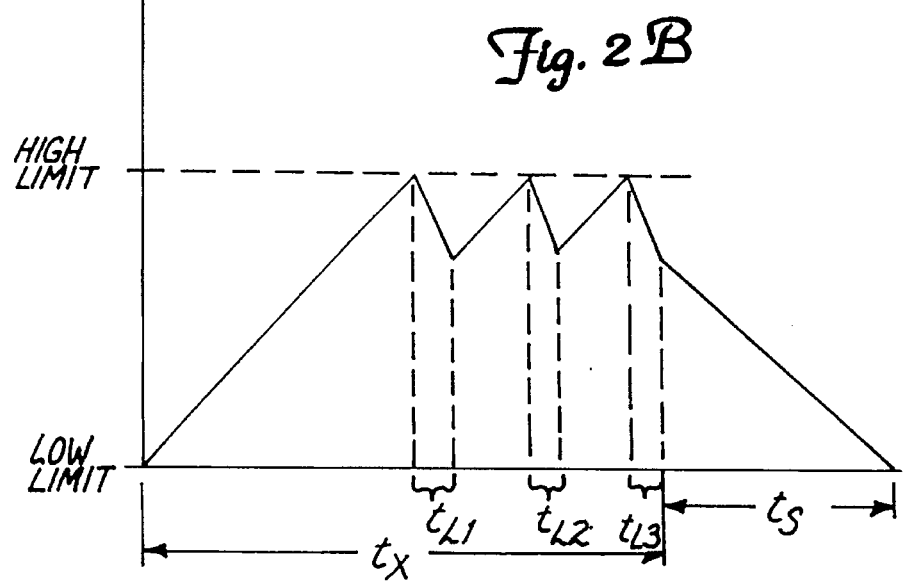
FIG. 2B is a plot of the output of an integrator using the conversion shown in FIG. 2A.

A more detailed operation of A/D converter 10 can be better understood with reference to FIGS. 1, 2A and 2B. As briefly mentioned above, controller 12 operates switches 14 and 16 to apply current sources $I_L$ and $I_S$ to integrator 20 in order to bring the output of integrator 20 to the low limit. This is indicated by block 28 in FIG. 2A.

Controller 12 then opens switches 14 and 16 and closes switch 18 to connect current source $I_X$ to integrator 20. This is indicated by block 30 in FIG. 2A. Integrator 20 includes operational amplifier 32 and capacitor C1 and integrates the charge applied by variable current source $I_X$ at the inverting input of operational amplifier 32.

FIG. 2B is a plot of the charge $Q_X$ accumulated in integrator 20 versus time. When variable current $I_X$ is being integrated, the charge accumulated in integrator 20 rises as shown in FIG. 2B. The entire time that variable current $I_X$ is integrated in integrator 20 is referred to as the conversion period $t_X$. Therefore, the integration of $I_X$ continues until the conversion period $t_X$ is complete. This is indicated by block 34 in FIG. 2A.

During the conversion time period $t_X$, $Q_X$ increases in magnitude until the output of integrator 20 reaches the high limit. This is indicated by block 36 in FIG. 2A. When the output of integrator 20 exceeds the high limit, comparator 22 provides a high limit signal to controller 12. In response to the high limit signal, controller 12 closes switch 14 which applies current $I_L$ to integrator 20. Since the magnitude of $I_L$ is greater than the magnitude of $I_X$, the net effect of both currents $I_L$ and $I_X$ being applied to integrator 20 is that quantity $Q_X$ decreases because it is being removed by $I_L$ faster than it is being accumulated by $I_X$. In other words, charge is removed from integrator 20 by the application of large reference current $I_L$. The time period during which switch 14 is closed and $I_L$ is applied to integrator 20 is referred to as $t_L$. The charge removed by $I_L$ for time $t_L$ can be referred to as a large charge packet.

The first time switch 14 is closed during the integrator time period is designated as $t_{L1}$ in FIG. 2B. The removal of large charge packets from integrator 20 is indicated by block 38 in FIG. 2A. This cycle is repeated until the conversion time period $t_X$ has elapsed. In the example shown in FIG. 2B, controller 12 closes switch 14 and applies large reference current $I_L$ to integrator 20 three times for time periods $t_{L1}$, $t_{L2}$ and $t_{L3}$.

Once the integration time period or conversion period $t_X$ has elapsed, controller 12 opens switch 18 so that variable current $I_X$ is disconnected from integrator 20. This is indicated by block 40 in FIG. 2A. Controller 12 then closes switch 16 (with switches 14 and 18 open) and removes any residual charge on integrator 20 by removing small charge packets through the application of small reference current $I_S$. The affect is to cause the charge accumulated in integrator 20 to ramp downward. Small reference current $I_S$ is applied to integrator 20 for a time period $t_S$, and small charge packets are removed from integrator 20 during time period $t_S$ until the output of integrator 20 reaches the low limit. At that time, the integration cycle is complete. This is indicated by blocks 42, 44 and 46 in FIG. 2A.

Output block 26 includes constants register 48, calibration register 50, multiplexer 52, arithmetic logic unit (ALU) 54 and data register 56. Depending on the desired ratio of $I_L$ to $I_S$, values are loaded into registers 48 and 50. In one preferred embodiment, the magnitude of $I_L$ is 32 times as large as the magnitude of $I_S$. Therefore, register 48 is loaded with a value of 32 and register 50 is loaded with a value of 1. As controller 12 operates switches 14, 16 and 18, it also manipulates output block 26. Data register 56 is initially set to zero. Then, for each clock period that controller 12 closes switch 14, it selects the value stored in constants register 48 to be multiplexed through mux 52 to ALU 54. Controller 12 then signals ALU 54 to add the value provided by register 48 to the value currently stored in data register 56.

Additionally, for each clock period that controller 12 causes switch 16 to be closed, controller 12 selects the value stored in calibration register 50 to be multiplexed through mux 52 to ALU 54. Controller 12 then signals ALU 54 to add the value from calibration register 50 to the value currently stored in data register 56.

Therefore, at the completion of the integration cycle when times $t_X$ and $t_S$ have elapsed, data register 56 contains a value indicative of the number of clock periods during which switches 14 and 16 were closed, respectively. This value is indicative of the amount of charge removed from integrator 20 and thus representative of the magnitude of variable current $I_X$.

More specifically, the charge stored in integrator 20 by application of variable current $I_X$ can be indicated as follows:

$$q = I_X t_X \qquad \text{Eq. 3}$$

Also, the total charge removed from integrator 20 by application of currents $I_L$ and $I_S$ should equal the charge accumulated in integrator 20 by application of current $I_X$. Therefore:

$$I_X t_X = I_L(t_{L1} + t_{L2} + t_{L3}) + I_S t_S \qquad \text{Eq. 4}$$

Assuming that each clock period is represented by $t_{CLK}$, then:

$$t_X = n_X t_{CLK}$$

$$t_{L1} = n_{L1} t_{CLK}$$

$$t_{L2} = n_{L2} t_{CLK}$$

$$t_{L3} = n_{L3} t_{CLK}$$

$$t_S = n_S t_{CLK}$$

where, $n_X$ is the number of clock periods ($t_{CLK}$) that $I_X$ is applied to integrator 20;

$n_S$ is the number of clock periods ($t_{CLK}$) that $I_S$ is applied to integrator 20; and $n_{L1}$, $n_{L2}$, and $n_{L3}$ are the number of clock periods ($t_{CLK}$) during time periods $t_{L1}$, $t_{L2}$, and $t_{L3}$, respectively.
Therefore:

$$I_X n_X t_{CLK} = I_L t_{CLK}(n_{L1}+n_{L2}+n_{L3}) + I_S t_{CLK} n_S \qquad \text{Eq. 5}$$

and $$I_X n_X = I_L(n_{L1}+n_{L2}+n_{L3}) + I_S n_S \qquad \text{Eq. 6}$$

Letting $n_{L1}+n_{L2}+n_{L3}=n_L=$ the total number of clk periods ($t_{TLK}$) during which $I_L$ is applied to integrator 20, then:

$$I_X = \frac{I_L n_L + I_S n_S}{n_X} \qquad \text{Eq. 7}$$

Assuming $I_L = 32 I_S$ then the smallest digital value (i.e, a digital 1) $= t_{CLK} \cdot I_S$.

Figure 3:
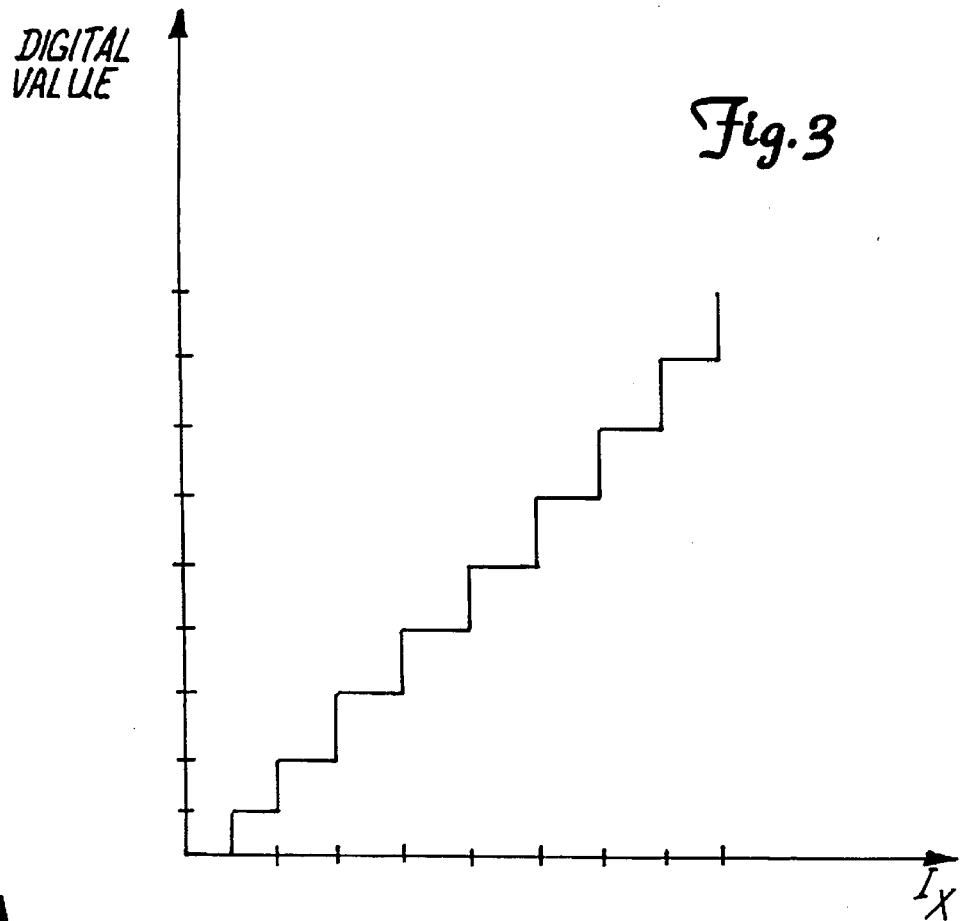
FIG. 3 is a plot of a preferred output of the A/D converter.

Assuming the ratio between $I_L$ and $I_S$ is exactly as expected (i.e., that $I_L$ is actually equal to $32 I_S$), then a continuous digital output is obtained from A/D converter 10, such as the curve shown in FIG. 3. Digital values are achieved, for example, as shown for the following values of $n_L$, $n_S$, and the digital output value:

| $n_L$ | $n_S$ | dig. val. |
|---|---|---|
| 1 | 31 | 63 |
| 2 | 0 | 64 |

In other words, where large reference current $I_L$ is applied for one clock period during the integration cycle, and where small reference current $I_S$ is applied for 31 clock periods, then the digital output value is 63 since $I_L = 32 I_S$. Further, if the large reference current $I_L$ is applied for two clock periods, and the small reference current $I_S$ is applied for zero clock periods, then the digital value is 64. This is the expected operation.

3. Errors Encountered In Conversion

Where the ratio between $I_L$ and $I_S$ is not precisely the desired ratio, then non-linearity and differential errors can arise in the output of the A/D converter. Such errors result in a discontinuous output which is very problematic.

For example, assume the small reference current $I_S$ is 10% greater than expected. Accordingly, it takes fewer clock cycles (and less time) than expected to discharge the remaining charge accumulated in integrator 20 during time $t_S$. For example, the following digital values result:

| $n_L$ | $n_S$ | dig. val. |
|---|---|---|
| 1 | 28 | 60 |
| 2 | 0 | 64 |

In other words, where large reference current $I_L$ is applied for one clock period, it takes only 28 clock periods for small reference current $I_S$ to remove the remaining charge accumulated in integrator 20. Thus, the digital output value is 60. However, where the large reference current $I_L$ is applied for two clock periods during the integration cycle, it takes no clock periods for the small current $I_S$ to remove any remaining charge in integrator 20. $I_S$ need not be applied. Thus, the digital value jumps to 64. This discontinuity is illustrated by curve A in FIG. 4. Such a four step jump makes it impossible to obtain the digital values 61, 62, and 63 from A/D converter 10.

As another example, assume that the small reference current $I_S$ has a magnitude which is 10% lower than desired. Accordingly, it takes more clock periods (and more time) than expected for $I_S$ to remove the charge accumulated in integrator 20 at the end of the integration period. For example, the following values result:

| $n_L$ | $n_S$ | dig. val. |
|---|---|---|
| 1 | 34 | 66 |
| 2 | 0 | 64 |

Figure 4:
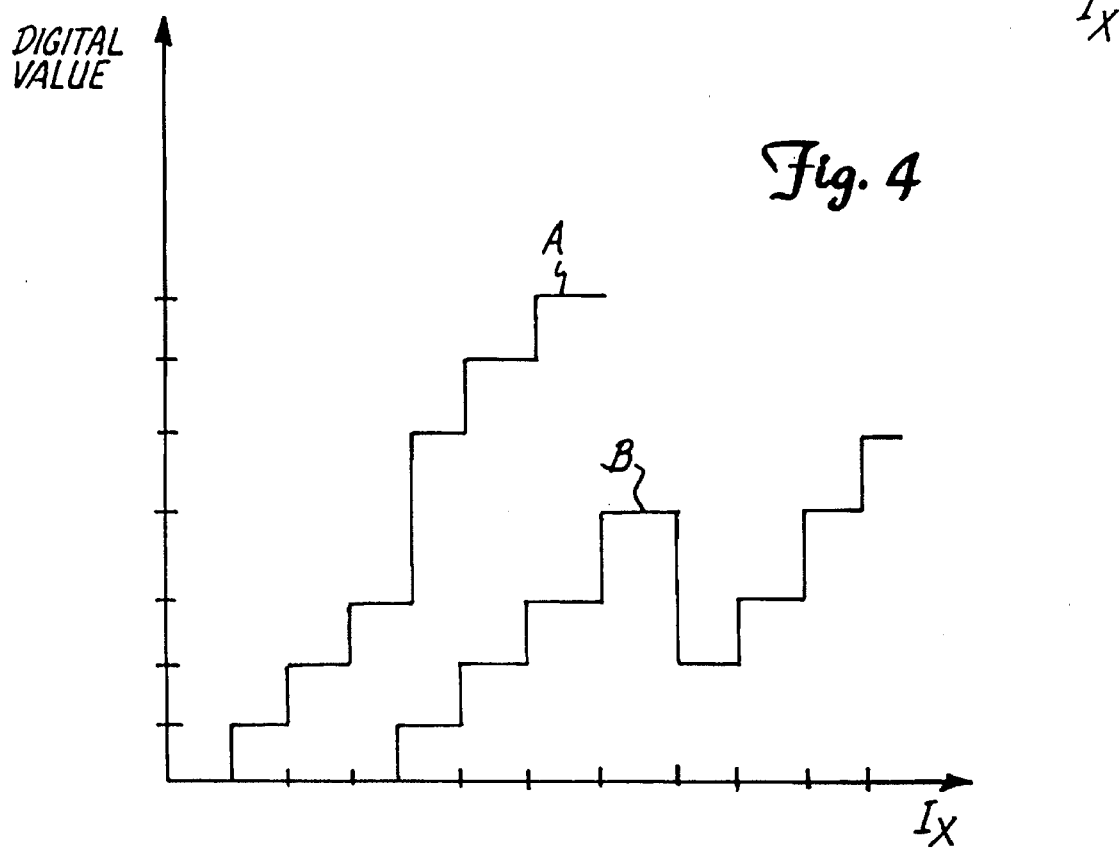
FIG. 4 is a plot of two types of errors observed when the A/D converter is not calibrated properly.

In other words, where large reference current $I_L$ is applied for one clock period, it takes 34 clock periods for small reference current $I_S$ to remove the remaining charge on integrator 20. This yields a digital output value of 66. However where the large reference current $I_S$ is applied twice during the integration time period, it takes zero clock periods to remove any remaining charge accumulated in integrator 20. This yields a digital output value of 64. Such a discontinuous output is plotted as curve B in FIG. 4. In essence, for a larger analog input value, the A/D converter actually takes a digital step backward. The errors represented by curves A and B in FIG. 4 are extremely problematic in that they are difficult to isolate and compensate.

4. Calibration Of Converter 10

With the present invention, the ratio of the magnitudes of $I_L$ and $I_S$ is no longer assumed to be the desired ratio. Rather, the present invention implements a system used to measure the actual ratio between currents $I_L$ and $I_S$. That actual ratio is used in making subsequent A/D conversions. The present invention implements a calibration technique which can best be understood with reference to FIGS. 5A, 5B and 5C.

Figure 5A:
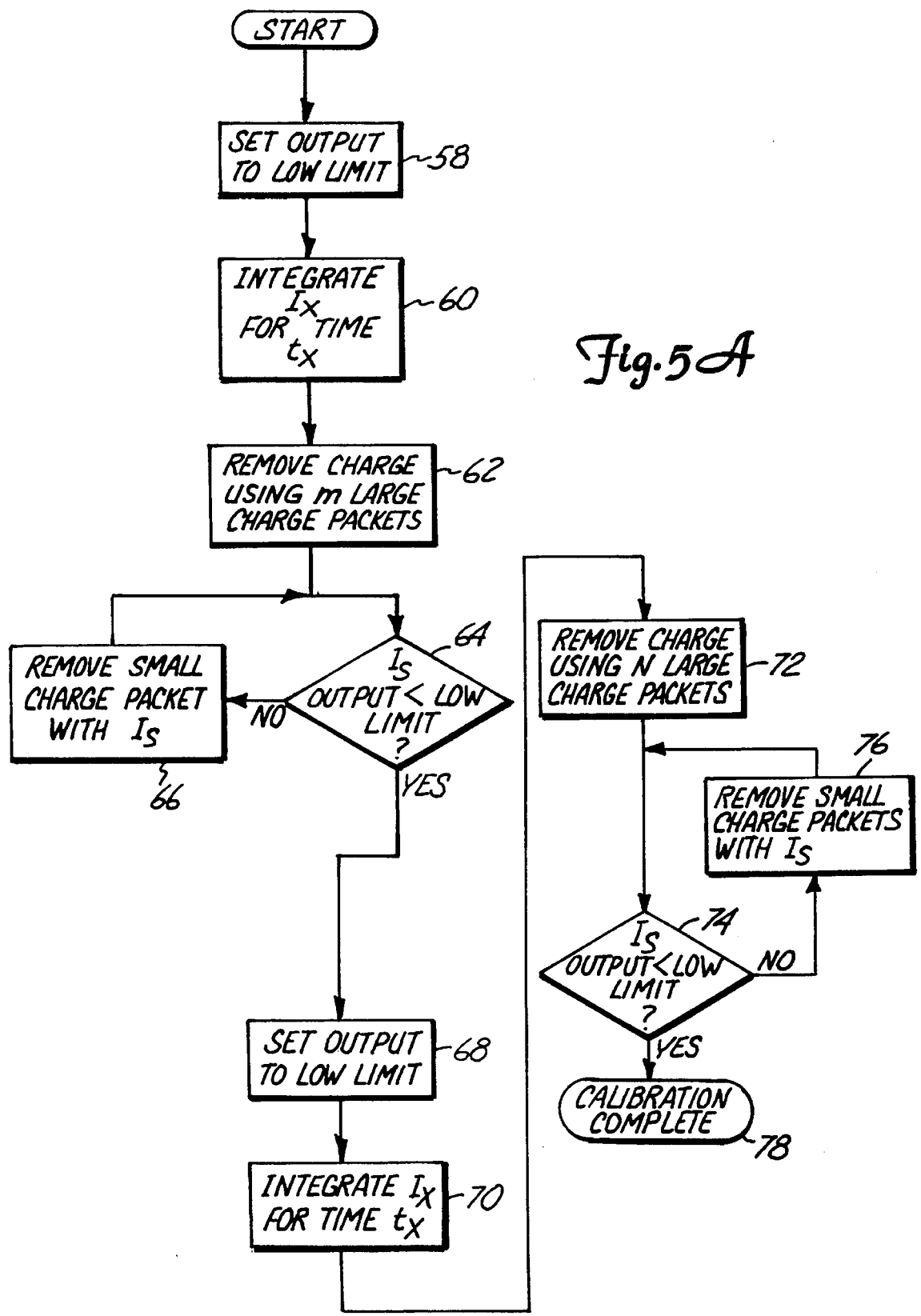
FIG. 5A is a flow diagram of the calibration system according to the present invention.

After the high and low limits are set for comparators 22 and 24, switches 14, 16 and 18 are controlled by controller 12 to set the output of integrator 20 to the low limit. This is indicated by block 58 in FIG. 5A. Then, controller 12 opens switches 14 and 16 and closes switch 18 to apply variable current $I_X$ to integrator 20. Current $I_X$ is integrated by integrator 20 for a time $t_X$. This is indicated by block 60 in FIG. 5A and is also shown in FIG. 5B. After time $t_X$, a number M of large charge packets are removed from integrator 20 using large reference current $I_L$. In other words, controller 12 opens switch 18 and closes switch 14 for M clock periods. This is indicated by block 62 in FIG. 5A and is shown by time period $t_{L1}$ in FIG. 5B. Thus, $t_{L1}$ equal to $M t_{CLK}$.

Controller 12 then opens switch 14 and closes switch 16 to apply small reference current $I_S$ to integrator 20. Using small reference current $I_S$, small charge packets are removed from integrator 20 until the output of integrator 20 is below the low limit set at the inverting input of comparator 24. In other words, controller 12 controls switch 16 so that it is closed for enough clock periods to remove remaining charge from integrator 20. This is indicated by block 64 and 66 in FIG. 5A and is shown as time period $t_S$ in FIG. 5B.

Once this is completed, controller 12 controls switches 14, 16 and 18 to again set the output of integrator 20 to the low limit value. This is indicated by block 68 in FIG. 5A.

Variable current $I_X$ is integrated for the time period $t_S$. This is indicated by block 70 in FIG. 5A and is shown as time period $t_X$ in FIG. 5C.

Controller 12 then opens switch 18 and closes switch 14 to apply large reference current $I_L$ to integrator 20 in order to remove a number N of large charge packets from the charge accumulated in integrator 20. The number N is different from the number M and is preferably less than the number M. Once N clock periods have passed (and consequently, N large charge packets have been removed from the charge accumulated in integrator 20). Controller 12 opens switch 14 and closes switch 16 to apply small reference current $I_S$ to integrator 20 in order to remove small charge packets from the charge accumulated in integrator 20. Switch 16 is closed for a number of clock periods required to remove the desired amount of charge from integrator 20. This is indicated by blocks 74 and 76 in FIG. 5A, and is shown as clock period $t_{S2}$ in FIG. 5C. Once the output of integrator 20 has returned to the low limit, the calibration sequence is complete. This is indicated by block 78 in FIG. 5A.

In essence, during the calibration cycle, integrator 20 is first charged to a desired level and charge is removed by applying reference currents $I_L$ and $I_S$. Then, integrator 20 is again charged to the exact same level, and charge is again removed by currents $I_L$ and $I_S$, but using a different number of clock periods for $I_L$ and $I_S$ than during the first integration. With this information, controller 12 determines the precise ratio between $I_L$ and $I_S$ as follows:

The amount of charge of primary interest is labeled Q in FIGS. 5B and 5C. This amount of charge was first removed from integrator 20 using large reference current $I_L$ during a time period $t_{L1}-t_{L2}$. The same amount of charge, Q, was also removed using small reference current $I_S$. However, a time $t_{S2}-t_{S1}$ was required to remove charge Q. Therefore:

$$Q = I_L(t_{L1} - t_{L2}) \quad \text{Eq. 8}$$

and $$Q = I_S(t_{S2} - t_{S1}) \quad \text{Eq. 9}$$

Therefore, $$I_L(t_{L1} - t_{L2}) = I_S(t_{S2} - t_{S1}) \quad \text{Eq. 10}$$

and $$\frac{I_L}{I_S} = \frac{t_{S2} - t_{S1}}{t_{L1} - t_{L2}} \quad \text{Eq. 11}$$

Since all of the time periods $t_{L1}$, $t_{L2}$, $t_{S1}$ and $t_{S2}$ are known by controller 12, the precise ratio of $I_L$ to $I_S$ can be measured and used in subsequent conversions. For instance, if the actual ratio of $I_L$ to $I_S$ is not 32 to 1, but is rather 32 to 1.1, the value 32 is stored in constants register 48 and the value 1.1 is stored in calibration register 50. In the preferred embodiment, calibration register 50 is a 30 bit register which has a number of register locations implied to the right of the decimal point. Thus, a very precise ratio of $I_L$ to $I_S$ can be obtained and used in subsequent conversions.

The calibration technique of the present invention can be carried out in a number of different ways. FIGS. 6A and 6B illustrate a second embodiment of the present calibration technique. In FIG. 6A, integrator 20 first integrates variable current $I_X$ for a time period $t_X$. Then, the charge is removed from integrator 20 by applying current $I_L$ for a time period $t_L$. Finally, the residual charge on integrator 20 is removed by applying reference current $I_S$ for a time period $t_{S1}$.

Next, integrator 20 reaccumulates charge by applying current $I_X$ for the time $t_X$. Then, all of the charge is removed from integrator 20 using small reference current $I_S$ by applying it to integrator 20 for time $t_{S2}$. The amount of charge Q previously removed from integrator 20 by the application of large current $I_L$ during time $t_L$ is equal to the amount of charge Q removed from integrator 20 by applying small reference current $I_S$ during time period $t_{S2}-t_{S1}$. Therefore:

$$I_L t_L = I_S(t_{S2} - t_{S1}) \quad \text{Eq. 12}$$

and $$\frac{I_L}{I_S} = \frac{t_{S2} - t_{S1}}{t_L} \quad \text{Eq. 13}$$

Thus, the precise ratio of $I_L$ to $I_S$ is determined, stored in registers 48 and 50, and used in subsequent A/D conversions.

FIGS. 7A and 7B show yet another embodiment of the present calibration technique. FIG. 7A shows that during the time in which switch 18 is closed and variable current $I_X$ is applied to integrator 20, controller 12 closes switch 14 twice to apply large reference current $I_L$ to integrator 20 for two time periods $t_{L1}$ and $t_{L2}$, respectively. Then, after the integration period $t_X$, the charge accumulated on integrator 20 is removed by opening switches 14 and 18 and closing switch 16 to apply small reference current $I_S$ for a time $t_{S1}$.

FIG. 7B shows that variable current $I_X$ is again applied to integrator 20 for the time $t_X$ and that, during that time, large reference current $I_L$ is only applied to integrator 20 once for a time period $t_{L3}$. Since the integration time period for variable current $I_X$ is the same in both cases ($t_X$), the amount of charge removed during application of currents $I_L$ and $I_S$ is the same. However, the amount of time each current was applied to integrator 20 has changed from FIG. 7A to FIG. 7B. Thus:

$$I_L(t_{L1} + t_{L2}) + I_S t_{S1} = I_L t_{L3} + I_S t_{S2} \quad \text{Eq. 14}$$

therefore, $$\frac{I_L}{I_S}(t_{L1} + t_{L2}) + t_{S1} = \frac{I_L}{I_S} t_{L3} + t_{S2} \quad \text{Eq. 15}$$

and, $$\frac{I_L}{I_S}(t_{L1} + t_{L2}) - \frac{I_L}{I_S} t_{L3} = t_{S2} - t_{S1} \quad \text{Eq. 16}$$

$$\frac{I_L}{I_S}(t_{L1} + t_{L2} - t_{L3}) = t_{S2} - t_{S1} \quad \text{Eq. 17}$$

Thus, $$\frac{I_L}{I_S} = \frac{t_{S2} - t_{S1}}{t_{L1} + t_{L2} - t_{L3}} \quad \text{Eq. 18}$$

Therefore, again, the precise relationship between $I_L$ and $I_S$ is known and can be used in subsequent A/D conversions.

Since division can be problematic in logical circuits, the above equation can be solved using another implementation to generate the calibration constant used in future A/D conversions. For example, let $D_S$ be the digital value assigned to $I_S$ applied for one clock period $t_{CLK}$ (e.g., $D_S=1$);

let $D_L$ be the digital value assigned to $I_L$ applied for one clock period $t_{CLK}$ (e.g., $D_L=32$);

Then if $I_L/I_S$ is nominally equal to 32, then $D_L/D_S$ is also nominally equal to 32. The nominal value of $D_S$ is stored in the calibration register and is corrected or updated by the following relationship:

$$D_S' = D_S \cdot \frac{I_S}{I_{SNOM}} \qquad \text{Eq. 19}$$

where $D'_S$ = the updated or corrected value of $D_S$;
$I_S$ = the actual value of $I_S$; and
$I_{SNOM}$ = the nominal value for $I_S$.

Letting $$d_L = D_L \cdot \frac{\Delta t_L}{t_{CLK}}$$

and $$d_S = D_S \cdot \frac{\Delta t_S}{t_{CLK}}$$

where $\Delta t_L = t_{L1} + t_{L2} - T_{L3}$ and
$\Delta t_S = t_{S2} - t_{S1}$ Then substituting into Eq. 18

$$\frac{I_L}{I_S} = \frac{\Delta t_S}{\Delta t_L} = \frac{\frac{d_S}{D_S}}{\frac{d_L}{D_L}} = \frac{D_L}{D_S} \cdot \frac{d_S}{d_L} \qquad \text{Eq. 20}$$

so $$I_S = I_L \frac{D_S}{D_L} \cdot \frac{d_L}{d_S} \qquad \text{Eq. 21}$$

Substituting into Eq. 19

$$D_S' = D_S \frac{I_S}{I_{SNOM}} = D_S \frac{I_L}{I_{SNOM}} \cdot \frac{D_S}{D_L} \cdot \frac{d_L}{d_S} \qquad \text{Eq. 22}$$

Using an approximation taking the general form $$\frac{x}{y} \approx 1 + \frac{x-y}{x} \text{ for } \frac{x-y}{x} \gg 1 \qquad \text{Eq. 23}$$

which is true in Eq. 22 if the relative error between $I_L$ and $I_S$ is less than 20%, then rewriting $d_L/d_S$ in Eq. 22 yields $$D_S' = D_S \frac{I_L}{I_{SNOM}} \cdot \frac{D_S}{D_L} \left[ 1 + \frac{d_L - d_S}{d_L} \right] \qquad \text{Eq. 24}$$

The term $$\frac{I_L}{I_{SNOM}} \cdot \frac{D_S}{D_L}$$

is approximately 1, thus $$D_S' = D_S + \frac{D_S}{d_L}(d_L - d_S) \qquad \text{Eq. 25}$$

If $d_L$ and $D_S$ are chosen to be nominally powers of two, then the correction can be implemented without division, but with only addition, subtraction and shifting (i.e., multiplication and division by powers of two) using the following simplification:

$$D'_S = D_S + 2^{-k}(d_L - d_S) \qquad \text{Eq. 26}$$

The approximations and simplifications used can introduce some error. However, by iteratively applying this implementation, such errors can be essentially eliminated. For instance, iterations can be continued until the difference between the old value of $D_S$ and the updated value is insignificant or below a threshold value.

The term $d_L - d_S$ can be computed by incrementing a counter by $D_L$ and $D_S$ for each clock period of $I_L$ and $I_S$, respectively, during a first portion of the calibration, and decrementing by $D_L$ and $D_S$ for each clock period of $I_L$ and $I_S$ during a second portion of the calibration. Therefore, assuming $t_{L1}$ and $t_{12}$ each in FIGS. 7A and 7B represent one clock pulse, and $t_{S1}$ represents 50 clock pulses, the total count in the counter after executing the sequence illustrated in FIG. 7A would be 114 (i.e., 32+32+50). Then, during the portion illustrated by FIG. 7B, the same counter can be decremented. The difference in counts yields the error (the difference between the actual ratio of $I_L$ to $I_S$ and the desired ratio). For example, if $t_{S2}$ in FIG. 7B is equal to 80 counts, then the total counts illustrated in FIG. 7B would be 112 (i.e., 32+80). Thus, the error would be 2. This error would then be right shifted by k bits and added to $D_S$ to calculate the corrected $D_S$ ($D'_S$). The corrected $D_S$ would then be used in subsequent A/D conversions and calibrations.

During any of these embodiments, the large and small current sources $I_L$ and $I_S$ can be applied to integrator 20 for any number of clock periods. However, it has been found that applying large current source $I_L$ for a minimum of eight clock periods, and applying small current source $I_S$ for a minimum of one clock period has worked suitably. The magnitude of $I_L$ is preferably 32 times that of $I_S$. Therefore, since $I_L$ is applied to integrator for a minimum of eight clock periods and $I_S$ is applied for a minimum of one clock period, the ratio of the minimum application periods of currents $I_L$ and $I_S$ is 256 to 1 (8×32:1).

It should also be noted that, while A/D converter 10 is shown in FIG. 1 using an arithmetic logic unit 54, the same results could be accomplished using a counter and a logic circuit surrounding the counter to count the clock pulses during which the various current sources are applied to integrator 20.

Further, while A/D converter 10 as shown in FIG. 1 as having current sources $I_L$, $I_S$ and $I_X$, the same effect can be obtained using voltage applied across resistors having a given ratio, or using switched capacitors.

In addition, the divisions in order to determine the ratio of $I_L$ to $I_S$ can be accomplished using a simple and conventional iterative adding or subtracting technique.

Further, controller 12 also typically includes a state machine, or state machine logic which is implemented in order to generate the proper sequence of steps on the control lines provided to the switches and output block 26. Such a state machine can either be implemented as an integral part of controller 12, in software, or as a separate logical circuit.

It should also be noted that the present calibration technique can be repeated a number of times to obtain an average actual ratio. The average actual ratio is than used in subsequent A/D conversions in order to improve accuracy.

The calibration process can also be repeated as often as required to cancel temperature and drift effects.

The present techniques can also be implemented in the manufacturing process. Using the results of the calibration technique, the current sources can be adjusted during manufacturing, or the resistors can be trimmed to obtain a desired precise ratio.

Figure 8:
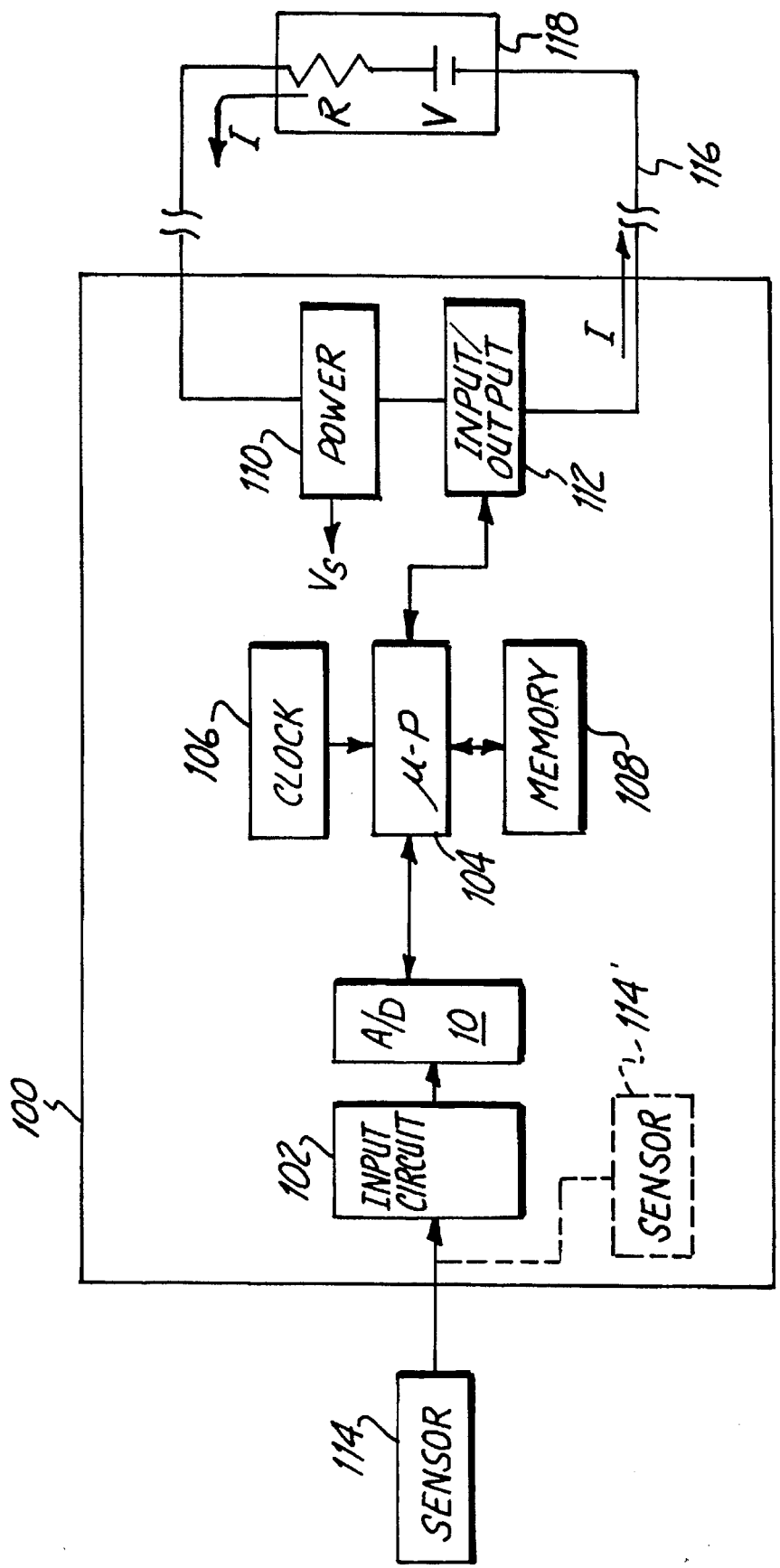
FIG. 8 is a block diagram showing the A/D converter of the present invention implemented in a transmitter.

FIG. 8 is a block diagram of A/D converter 10 implemented in a transmitter 100. Transmitter 100 also includes input circuit 102, microprocessor 104, clock 106, memory 108, power distribution circuit 110 and input/output circuit 112. Transmitter 100 is coupled to a sensor 114 which senses an unknown parameter, such as temperature, pressure, differential pressure flow, pH, or other variable process control parameter. Transmitter 100 is also connected, by current loop 116, to a remote control room 118. In FIG. 8, control room 118 is represented by resistor R and voltage source V.

In operation, sensor 114 senses the desired parameter and provides a sensor signal to input circuit 102 which is representative of the sensed parameter. In the preferred embodiment, input circuit 102 is a signal conditioning circuit, such as a buffer, a level-shifter or an amplifier. Input circuit 102 provides a conditioned output signal to A/D converter 10. It should be noted that in pressure transmitters, the sensor is typically inside the transmitter housing. This is illustrated by sensor 114' shown in phantom in FIG. 8. In flow transmitters and many temperature transmitters, the sensor is outside the transmitter housing. This is indicated by sensor 114. Both arrangements are contemplated by the present invention.

A/D converter 10 converts the conditioned output signal from input circuit 102 to a digital signal according to the previous description. The digital signal is provided to microprocessor 104. In the preferred embodiment, microprocessor 104 is coupled to clock 106 and memory 108. Clock 106 provides timing to microprocessor 104, and memory 108 provides program instructions and other information which is accessed by microprocessor 104 during operation of transmitter 100.

Microprocessor 104 compensates the digitized sensor signal from A/D converter 10 for known repeatable errors in sensor 114 and provides a compensated output to I/O circuitry 112. In a preferred embodiment, I/O circuitry 112 outputs a 4–20 mA current onto loop 116 as a function of the compensated output. Alternatively, circuit 112 couples a digital signal representative of the compensated output onto loop 116.

Power distribution circuit 110 provides a regulated voltage output $V_S$ powering the remainder of the circuitry in transmitter 100. Power distribution circuit 110 is energized by controller 118.

A/D converter 10 of the present invention is specifically well suited for implementation in a transmitter, such as transmitter 100. Many such transmitters require a high degree of accuracy and resolution. Thus, the improved accuracy provided by A/D converter 10 lends itself well to such an implementation.

In transmitters, such as transmitter 100, which are wholly energized by an external source of power, power requirements are very critical. Since A/D converter 10 is highly calibratable without the addition of any calibration circuitry, A/D converter 10 does not increase power consumption of transmitter 100 and thus does not exacerbate power requirement problems. Thus, A/D converter 10 is well suited to implementation in transmitter 100.

Although the present invention has been described with reference to preferred embodiments, workers skilled in the art will recognize that changes may be made in form and detail without departing from the spirit and scope of the invention.

What is claimed is:

1. A method of calibrating an analog-to-digital converter having a charge accumulator and first and second reference charge transfer circuits providing first and second reference charge, respectively, the method comprising:

accumulating a first quantity of charge in the accumulator during a first accumulation time period;

removing accumulated charge from the first quantity of charge in the accumulator by applying the first and second reference charge transfer circuits to the accumulator in first and second time periods, respectively, until the accumulated charge in the accumulator reaches a threshold level;

accumulating a second quantity of charge in the accumulator during a second accumulation time period;

removing accumulated charge from the second quantity of charge in the accumulator by applying the first and second reference charge transfer circuits in third and fourth time periods, respectively, until the accumulated charge reaches the threshold level;

computing relative magnitudes of the first and second reference charge provided by the first and second reference charge transfer circuits based on the relative magnitudes of the first and second quantities of charge and the applications of the first and second reference charge transfer circuits during the first, second, third and fourth time periods; and performing subsequent analog-to-digital conversions based on the relative magnitudes of the first and second reference charge computed.

2. The method of claim 1 wherein the charge accumulator comprises an integrator, and the first and second charge transfer circuits comprise first and second reference current circuits that supply first and second reference currents, respectively, and wherein accumulating a first quantity of charge comprises:

applying a charging current to the integrator for a first charging time period; and wherein accumulating a second quantity of charge comprises applying the charging current to the integrator for a second charging time period.

3. The method of claim 2 wherein applying the first reference current for the first time period comprises applying the first reference current during multiple time intervals during one of the first and second charging time periods.

4. The method of claim 1 wherein the third time period is substantially zero.

5. The method of claim 1 wherein the second time period is substantially zero.

6. The method of claim 1 and further comprising:

performing analog-to-digital conversions based on the relative magnitudes determined.

7. The method of claim 1 and further comprising:

performing the steps of accumulating and removing the first and second quantities of charge a plurality of times;

averaging respective time periods during which the first and second reference currents are applied to obtain average time periods; and determining the relative magnitudes based on the average time periods.

8. The method of claim 1 wherein the time periods are determined based on a number of counts of charge packets provided to the integrator.

9. The method of claim 1 wherein the first and second quantities of charge are substantially equal and wherein at least one of the following is true:

the first and third time periods are not equal; and the second and fourth time periods are not equal.

10. The method of claim 1 wherein at least portions of at least two of the first, second, third, fourth, first accumulation and second accumulation time periods occur simultaneously.

11. The method of claim 1 wherein at least one of the first, second, third, fourth, first accumulation and second accumulation time periods are discontinuous and are comprised of a plurality of time periods.

12. A method of calibrating an analog-to-digital converter having an integrator and first and second reference current circuits providing first and second reference currents, respectively, the method comprising:

applying a charging current to the integrator for a charging time period to accumulate charge in the integrator based on the charging current;

applying the first reference current to the integrator for a first time period to remove charge from the integrator;

applying the second reference current to the integrator for a second time period to remove charge from the integrator, wherein charge is removed from the integrator by application of one of the first and second reference currents until the charge accumulated in the integrator reaches a threshold level;

re-applying the charging current to the integrator for the charging time period;

removing charge from the integrator by applying the second reference current for a third time period, different than the second time period;

determining the magnitude of the first reference current relative to the magnitude of the second reference current based on the first, second and third time periods; and calibrating the analog-to-digital converter based on the magnitude of the first reference current relative to the magnitude of the second reference current.

13. A method of calibrating an analog-to-digital converter, comprising:

accumulating charge in an integrator by integrating a current for a first time interval;

removing charge from the integrator using a first number of first charge packets having a first magnitude and a first number of second charge packets having a second magnitude until the charge accumulated in the integrator reaches a first threshold level;

accumulating charge in the integrator by integrating the current for a second time interval having a magnitude substantially the same as the first time interval;

removing charge from the integrator using a second number of first charge packets, different from the first number of first charge packets, and a second number of second charge packets;

determining a relationship between the magnitudes of the first and second charge packets based on the first and second numbers of charge packets used; and performing subsequent analog-to-digital conversions based on the relationship determined.

14. An analog-to-digital converter, comprising:

a charge accumulator;

first reference charge provision means for providing to the charge accumulator a first reference charge having a first polarity;

second reference charge provision means for providing to the charge accumulator a second reference charge having the first polarity;

third charge provision means for providing to the charge accumulator a third charge having a second polarity;

switch means for operatively coupling the first and second reference charge provision means and the third charge provision means to the charge accumulator;

a controller, coupled to the switch means, operating the switch means to selectively couple the third charge provision means to the charge accumulator to accumulate a first charge quantity in the charge accumulator, and for selectively coupling the first and second reference charge provision means to the charge accumulator to remove the first charge quantity;

a calibrator, coupled to the controller, for providing an output based on the controller selectively coupling the charge provision means to the charge accumulator, the output being indicative of a relationship between the first and second reference charge provision means, the controller controlling the calibrator so that analog-to-digital conversions are performed based on the relationship.

15. The analog-to-digital converter of claim 14 wherein the first and second reference charge provision means comprise:

first and second current sources providing first and second reference currents, respectively.

16. The analog-to-digital converter of claim 15 wherein the relationship comprises a ratio of one of the first and second reference currents to another of the first and second reference currents, and wherein the calibrator provides an output indicative of the ratio.

17. The analog-to-digital converter of claim 16 wherein the controller includes a clock providing a clock signal having clock pulses, and wherein the third charge provision means comprises a third current source.

18. The analog-to-digital converter of claim 17 wherein the charge accumulator comprises an integrator, and wherein the controller controls the switch means to connect the third current source to the integrator to accumulate the first charge quantity and controls the switch means to connect the first and second current sources to the integrator, for a first and second number of clock pulses, n1 and n2, respectively, to remove the first charge quantity;

wherein the controller controls the switch means to reconnect the third current source to recharge the integrator to the first charge quantity and controls the switch means to reconnect the first and second current sources to the integrator for a third and fourth number of clock pulses, n3 and n4, respectively, to remove the first charge quantity; and wherein n1 is different from n2 and n3 is different from n4.

19. The analog-to-digital converter of claim 18 wherein the calibrator comprises:

a counter providing an output indicative of the first, second, third and fourth numbers of clock pulses, n1, n2, n3 and n4; and wherein the calibrator provides the output indicative of the ratio based on the numbers n1, n2, n3 and n4.

20. A transmitter having an analog-to-digital converter, the analog-to-digital converter comprising:

an accumulator;

a first reference circuit, selectively coupled to the accumulator, providing a first reference charge;

a second reference circuit, selectively coupled to the accumulator, providing a second reference charge;

charge provision means, selectively coupled to the accumulator, for accumulating a first quantity of charge in the accumulator;

control means, operably coupled to the first and second reference circuits and the charge provision means, for removing accumulated charge from the accumulator by applying the first and second reference charges to the accumulator in first and second time periods, respectively, until the accumulated charge reaches a threshold level;

wherein the control means controls the charge provision means to re-accumulate a second quantity of charge in the accumulator and removes accumulated charge from the second quantity of charge in the accumulator by applying the first and second reference charges in third and fourth time periods, respectively, until the accumulated charge reaches the threshold level; and wherein the control means includes determining means for determining relative magnitudes of the first and second reference charges based on the relative magnitudes of the first and second quantities of charge and the application of the first and second reference charges during the first, second, third and fourth time periods.

21. The analog-to-digital converter of claim 20 wherein the accumulator is an integrator, the first and second charge quantities are substantially equal to one another, and the first, second, third and fourth time periods are governed by at least one of the following:

the first time period does not equal the third time period; and the second time period does not equal the fourth time period.

22. The analog-to-digital converter of claim 20 wherein the control means comprises:

means for performing analog-to-digital conversions based on the relative magnitudes determined.

23. An analog-to-digital converter, comprising:

a charge accumulator;

a first reference charge circuit providing to the charge accumulator a first reference charge having a first polarity;

a second reference charge circuit providing to the charge accumulator a second reference charge having the first polarity;

a third charge circuit providing to the charge accumulator a third charge having a second polarity;

a plurality of switches coupling the first and second reference charge circuits and the third charge circuit to the charge accumulator;

a controller, coupled to the switches, operating the switches to selectively couple the third charge circuit to the charge accumulator to accumulate a first charge quantity in the charge accumulator, and for selectively coupling the first and second reference charge circuits to the charge accumulator to remove the first charge quantity;

a calibrator, coupled to the controller, for providing an output based on the controller selectively coupling the charge circuits to the charge accumulator, the output being indicative of a relationship between the first and second reference charge circuits, the controller controlling the calibrator so that analog-to-digital conversions are performed based on the relationship.

24. A method of calibrating an analog-to-digital converter having a charge accumulator and first and second reference charge transfer circuits providing first and second reference charge, respectively, the method comprising:

applying at least one of the first and second charge transfer circuits to the charge accumulator during a first phase to move charge relative to the charge accumulator;

re-applying at least one of the first and second charge transfer circuits to the charge accumulator during a second phase to move charge relative to the charge accumulator; and determining relative magnitudes of the first and second reference charge transfer circuits based on a comparison of time periods or number of time periods during which the first and second charge transfer circuits are applied to the charge accumulator during the first and second phases wherein, during one of the first and second phases, both the first and second charge transfer circuits are applied to the charge accumulator.

25. The method of claim 24 and further comprising:

before applying at least one of the first and second reference charge transfer circuits to the charge accumulator, applying a third charge transfer circuit to the charge accumulator to accumulate a first charge in the charge accumulator.

26. The method of claim 24 and further comprising:

before re-applying at least one of the first and second charge transfer circuits to the charge accumulator, applying the third charge transfer circuit to the charge accumulator to accumulate a second charge in the charge accumulator.

27. The method of claim 24 wherein applying at least one of the first and second reference charge transfer circuits comprises:

applying the first reference charge transfer circuit to the charge accumulator for a first time period; and applying the second reference charge transfer circuit to the charge accumulator for a second time period.

28. The method of claim 27 wherein re-applying at least one of the reference charge transfer circuits comprises:

re-applying the first reference charge transfer circuit to the charge accumulator for a third time period; and re-applying the second reference charge transfer circuit to the charge accumulator for a fourth time period;

wherein the first and third time periods are different from one another and the second and fourth time periods are different from one another.

29. The method of claim 28 wherein one of the first, second, third and fourth time periods are zero.

30. The method of claim 28 wherein the time periods are determined based on a number of counts of charge packets provided to the charge accumulator.

31. The method of claim 28 wherein at least portions of at least two of the first, second, third and fourth time periods occur simultaneously.

32. The method of claim 28 wherein at least one of the first, second, third and fourth time periods are discontinuous and are comprised of a plurality of spaced time intervals.

33. The method of claim 24 and further comprising:

performing the steps of applying and re-applying at least one of the first and second charge transfer circuits to the charge accumulator a plurality of times;

averaging respective time periods during which the first and second reference charge transfer circuits are applied to obtain average time periods; and determining the relative magnitudes based on the average time periods.

* * * * *

UNITED STATES PATENT AND TRADEMARK OFFICE
CERTIFICATE OF CORRECTION

PATENT NO. : 5,621,406
DATED : April 15, 1997
INVENTOR(S) : Goetzinger et al.

It is certified that error appears in the above-indentified patent and that said Letters Patent is hereby corrected as shown below:

Column 9, line 41, please delete the following equation:

$$\frac{x}{y} \approx 1 + \frac{x-y}{x} \quad \text{for } \frac{x-y}{x} >> 1$$

and insert the following equation:

$$\frac{x}{y} \approx 1 + \frac{x-y}{x} \quad \text{for } \frac{x-y}{x} << 1$$

Signed and Sealed this

Fourteenth Day of October, 1997

Attest:

BRUCE LEHMAN

*Attesting Officer*     *Commissioner of Patents and Trademarks*